United States Patent [19]

Sakamoto et al.

[11] Patent Number: 5,130,547

[45] Date of Patent: Jul. 14, 1992

[54] CHARGED-PARTICLE BEAM EXPOSURE METHOD AND APPARATUS

[75] Inventors: Kiichi Sakamoto, Tokyo; Yoshihisa Oae, Kawasaki; Shunsuke Fueki, Yokohama; Akio Yamada, Kawasaki; Hiroshi Yasuda, Yokohama, all of Japan

[73] Assignee: Fujitsu Limited, Kawasaki, Japan

[21] Appl. No.: 616,870

[22] Filed: Nov. 21, 1990

[30] Foreign Application Priority Data

Nov. 30, 1989 [JP] Japan .................. 1-312521

[51] Int. Cl.⁵ .............................. H01J 37/00
[52] U.S. Cl. .................. 250/492.2; 250/398
[58] Field of Search ............. 250/492.2, 492.23, 398

[56] References Cited

U.S. PATENT DOCUMENTS

| | | | |
|---|---|---|---|
| 3,876,883 | 4/1975 | Broers et al. | 250/492.23 |
| 3,956,635 | 5/1976 | Chang | 250/492.23 |
| 4,213,053 | 7/1980 | Pfeiffer | 250/492.23 |
| 4,243,866 | 1/1981 | Pfeiffer et al. | 250/492.2 |
| 5,008,830 | 4/1991 | Moriizumi et al. | 250/396 R |

FOREIGN PATENT DOCUMENTS 0083246 12/1982 European Pat. Off. .
0367496A2 10/1989 European Pat. Off. .

OTHER PUBLICATIONS

Electronics and Electrothemics and Metallurgy Division, Proceedings on the Symposium on Electron and Ion Beam Science and Technology, Apr. 13, 1979, pp. 149-159, Princeton, N.J.

Primary Examiner—Jack I. Berman
Assistant Examiner—Kiet T. Nguyen
Attorney, Agent, or Firm—Staas & Halsey

[57] ABSTRACT

A charged-particle beam exposure method which has a stencil mask formed with a several mask patterns, deflects a beam of charged particles to a mask pattern selected from among the several mask patterns and shapes the beam, and performs wafer exposure by deflecting the shaped beam and illuminating the same onto a wafer. The improvement comprises the steps of (a) holding mask information data, which are information for deflecting the charged particle beam to the selected mask pattern and in which an index is provided every mask pattern of the stencil mask, in a mask memory, (b) holding pattern exposure data, which are information for designating a mask pattern by the use of the index of each mask pattern held in the mask memory and for deflecting the charged particle beam shaped with the designated mask pattern to a predetermined region on the wafer, in a data memory; and (c) deflecting the charged particle beam of the stencil mask and shaping the beam by the use of the mask information data outputted from the mask memory in response to the index designated in the pattern exposure data.

14 Claims, 7 Drawing Sheets

CHARGED-PARTICLE BEAM EXPOSURE METHOD AND APPARATUS

FIELD OF THE INVENTION

The present invention relates to a charged-particle beam exposure method and more particularly to an exposure method that performs wafer exposure by selecting one of different shape apertures which are formed in a stencil mask.

DESCRIPTION OF THE PRIOR ART

A charged-particle beam exposure apparatus (hereinafter referred to as an "exposure apparatus"), which exposes wafers directly with a beam of charged particles such as electrons and ions, can form very fine patterns and is suitable for large-scale semiconductor IC fabrication.

However, since in the exposure apparatus of the above kind the IC patterns are formed on the wafer in the manner of "a single stroke of the brush", there is the drawback that time for formation of patterns becomes longer.

In order to avoid the drawback, there is known a charged-particle beam exposure apparatus using a stencil mask as shown in FIG. 5. Many of the basic circuits of a semiconductor IC repeat the same patterns, so a stencil mask 1 is formed with a plurality of mask patterns (1a, 1b, . . .) of FIG. 5 respectively corresponding to repeated patterns (P1, P2, . . .), as shown in FIG. 5. The mask pattern (for example, 1a) on the stencil mask 1 is formed with at least one aperture corresponding to the shape of repeated pattern (P1) and is an area in which a beam of charged particles can be deflected. The stencil mask 1 of FIG. 5 is disposed on the path of a beam of charged particles, and by selecting one of the mask patterns and passing the beam through the selected mask pattern, the shape of that mask pattern can be formed on a predetermined exposure position on a wafer. Consequently, exposure time can be saved by focusing the charged particle beam to a spot size and directing the focused beam to the predetermined exposure position on the wafer.

However, a conventional exposure method such as this requires a two-stage deflection operation: deflection operation (hereinafter referred to as "mask deflection") for selecting one of the mask patterns 1a, 1b. . ." of the stencil mask 1, and deflection operation (hereinafter referred to as "wafer deflection") for determining an exposure position on the wafer. Accordingly, different kinds of data corresponding to the two-stage deflection operation are needed.

FIGS. 6 and 7 schematically show the generation of deflection data.

In FIG. 6, the repeated pattern data P1, P2, P3 . . . of the same shape are extracted from design data (hereinafter referred as to "CD") of a semiconductor IC, and mask patterns 1a, 1b. . . corresponding to the repeated pattern data P1, P2, P3 . . . are formed on an exposure mask to fabricate a stencil mask 1.

Data for fabricating the stencil mask 1 (i.e., the shape and position data (hereinafter referred to as "MD") of each mask pattern) and the above-mentioned CD as a whole constitute one composite data file 3, as shown in FIG. 7. The composite data file 3 is stored in a medium 2 such as a magnetic tape.

When the wafer is exposed, the two-stage deflection operation is carried out in response to a deflection operation signal for the stencil mask 1 based upon the MD and a deflection operation signal for the wafer based upon the CD.

However, the above described conventional charged-particle beam exposure method suffers a drawback caused by the one composite data file 3 of MD and CD. For example, when the stencil mask is remade, it is difficult to update the composite data file 3.

On the stencil mask 1 exposed to the charged particle beam, the surrounding carbon atoms adhere to the surface of the mask due to the energy of the beam, and the mask pattern shape slightly changes with as time. For this reason, it will be necessary to remake the stencil mask 1 every predetermined cycle (about one-month cycle).

In addition, since it is almost inevitable that the new and old stencil masks are different in shape and position of the mask pattern because of process errors and the like, it is necessary to update the data file each time the stencil mask 1 is remade.

However, in the conventional composite data file of MD and CD, the update process (in practice, update to the same data) is performed for the MD and also for the CD in which no update is required. Since the CD normally has a large capacity, a large amount of time is needed for updating data, and it is thus difficult to update exposure data.

Accordingly, it is an object of the present invention to provide a charged-particle beam exposure method in which exposure data are easily updated by separating one composite data file of CD and MD into two individual data files and updating only MD when the stencil mask is remade.

SUMMARY OF THE INVENTION

In order to achieve the above object, as shown in FIG. 1, mask information data, which are information for deflecting a beam of charged particles properly with respect to the individual mask patterns on a stencil mask, are provided with indexes (for example, A, B, C, etc) respectively corresponding to the mask patterns and held in a mask memory. That is, the index is provided for every mask pattern. Pattern exposure data, which are information for designating a predetermined mask pattern by the use of the above-described index and for deflecting a charged particle beam shaped with the designated mask pattern to a predetermined region on a wafer, are held in a data memory. The mask information data are outputted from the mask memory by the use of the index designated in the pattern exposure data. In response to the output mask information data, the charged particle beam is deflected onto the designated mask pattern of the stencil mask and shaped. The shaped beam is deflected onto a region on the wafer that is designated with the pattern exposure data, and the designated region on the wafer is exposed.

Therefore, since only the data in the mask memory are updated as the stencil mask is remade, the exposure data can be easily updated.

BRIEF DESCRIPTION OF THE DRAWINGS

The above and other objects and advantages will become apparent from the following detailed description when read in conjunction with the accompanying drawings wherein.

DESCRIPTION OF THE PREFERRED EMBODIMENTS

Figure 1:
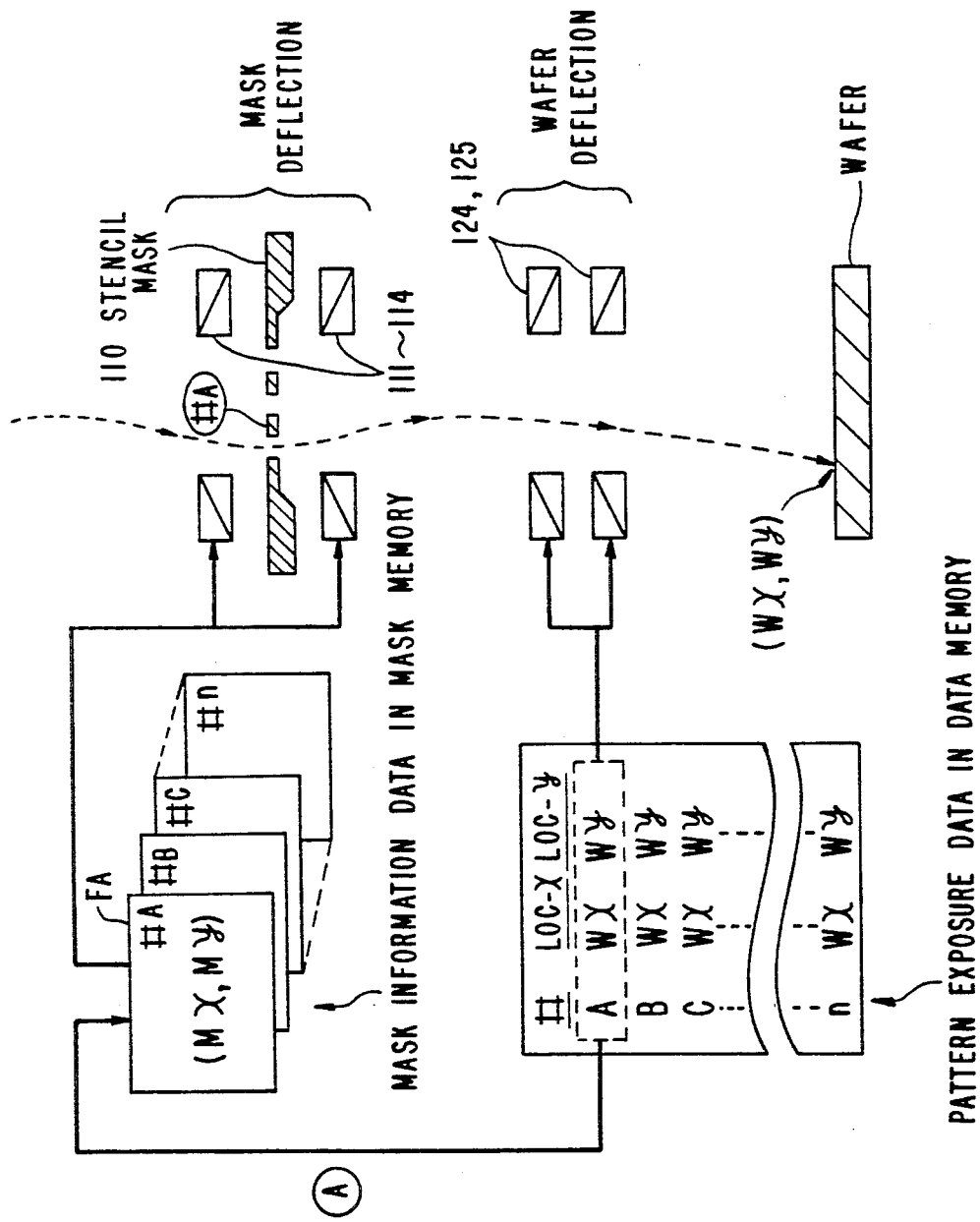
FIG. 1 illustrates the relationship between the mask information data and the pattern exposure data.

FIG. 1 shows the relationship between the pattern exposure data and the mask information data. The pattern exposure data are made as one independent file from the design data (corresponding to the CD of FIG. 6). In the pattern exposure data file, the index (#: A, B, C ... n) of a repeated pattern and the position coordinates (LOC-x: Wx, Wx, Wx ... Wx; LOC-y: Wy, Wy, Wy ... Wy) of the repeated pattern on the wafer are stored. The mask information data are the pattern design data of the stencil mask 110 fabricated by the exposure apparatus, and each of a plurality of mask patterns on the stencil mask 110 has a single auxiliary file. The mask information data are held by providing an index every mask pattern. For example, a repeated pattern #A has an auxiliary file FA, in which the position coordinates (Mx, My) of one mask pattern (corresponding to #A) on the stencil mask 110 are stored. Note that, as previously mentioned, the mask pattern (for example, la of FIG. 6) on the stencil mask 1 is formed with at least one aperture corresponding to the shape of the repeated pattern (for example, P1 of FIG. 6) and is an area in which a beam of charged particles can be deflected. Also, note that a plurality of the mask blocks constitute one of mask pattern areas on the mask and that the mask is mechanically moved when a beam of charged particles is illuminated from one mask pattern area to another mask block area.

Figure 2:
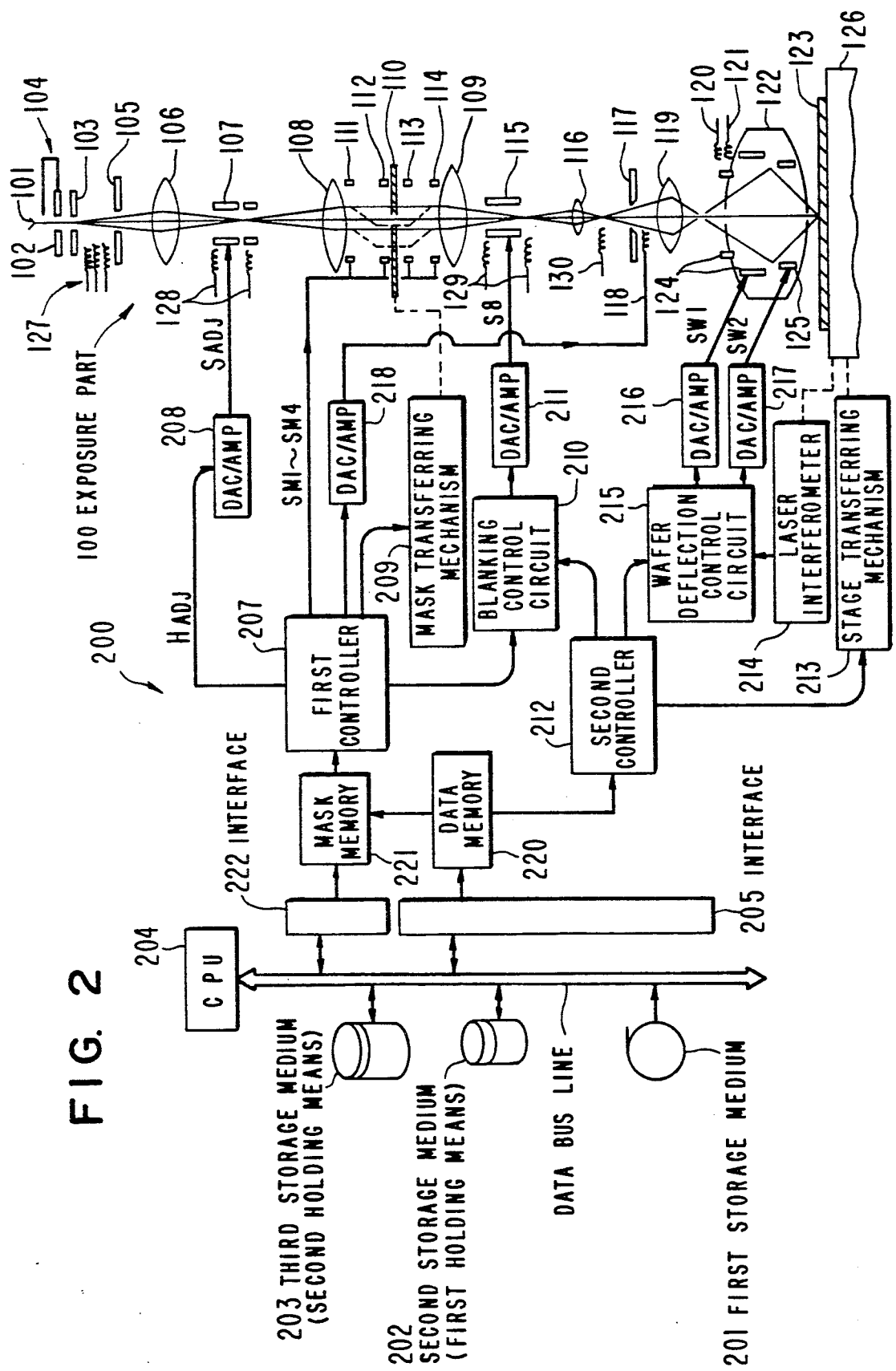
FIG. 2 is a schematic view showing an embodiment of an exposure apparatus to which a charged-particle beam exposure method according to the present invention may be applied.

When, for example, the repeated pattern #A is exposed, the mask deflection signals SM1-SM4 of FIG. 2 are generated on the basis of the mask information data file, and the wafer deflection signals SW1-SW2 of FIG. 2 are generated on the basis of the pattern exposure data file.

FIG. 2 schematically illustrates one embodiment of a charged-particle beam exposure apparatus to which a charged-particle beam exposure method according to the present invention may be applied. The charged-particle beam exposure apparatus is divided roughly into an exposure part 100 and an exposure control part 200.

The exposure part 100 comprises a source of a beam of charged particles 104 having a cathode electrode 101, a grid electrode 102 and an anode electrode 103, a first slit 105 for shaping a beam of charged particles (hereinafter referred to as a "beam") generated from the charged particle beam source 104 into, for example, a rectangle in section, and a first lens 106 for focusing the shaped beam. The exposure part 100 further comprises a slit deflector 107 for adjusting and deflecting the focused beam in response to an adjustment-deflection signal $S_{ADJ}$, a second lens 108 and a third lens 109 disposed in opposed relationship, a stencil mask 110 disposed between the second and third lenses 108 and 109 and movable in a horizontal direction (the left and right directions of FIG. 2), first to fourth deflectors 111-114 disposed in the opposite sides of the stencil mask 110 for deflecting the beam between the second and third lenses 108 and 109 and for selecting one of the mask patterns of the stencil mask 110, and beam-blanking plates 115 for turning the beam on and off in response to a beam-blanking signal SB. The exposure part 100 further comprises a third lens 116, a limiting aperture 117, a refocus coil 118, a fourth lens 119, a dynamic focus coil 120, a dynamic stigmator coil 121, a fifth lens 122, main deflection coils 124 and an electrostatic subdeflector 125 for directing the beam to any location on a wafer 123 in response to wafer deflection signals SW1 and SW2, a wafer stage 126 having the wafer 123 mounted thereon and movable in the X and Y directions of X-Y coordinates, and first to fourth alignment coils 127-130.

Figure 6:
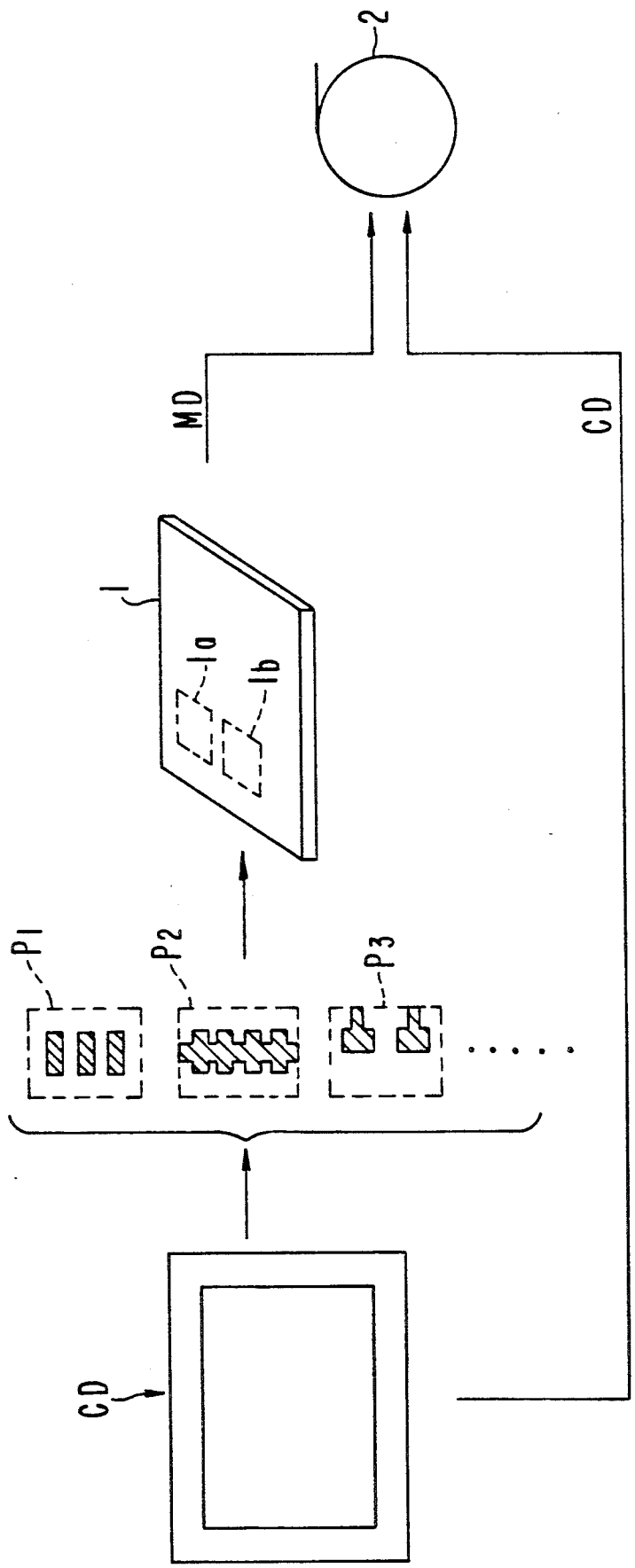
FIGS. 6 and 7 illustrate how the deflection data are generated in a conventional manner.
Figure 7:
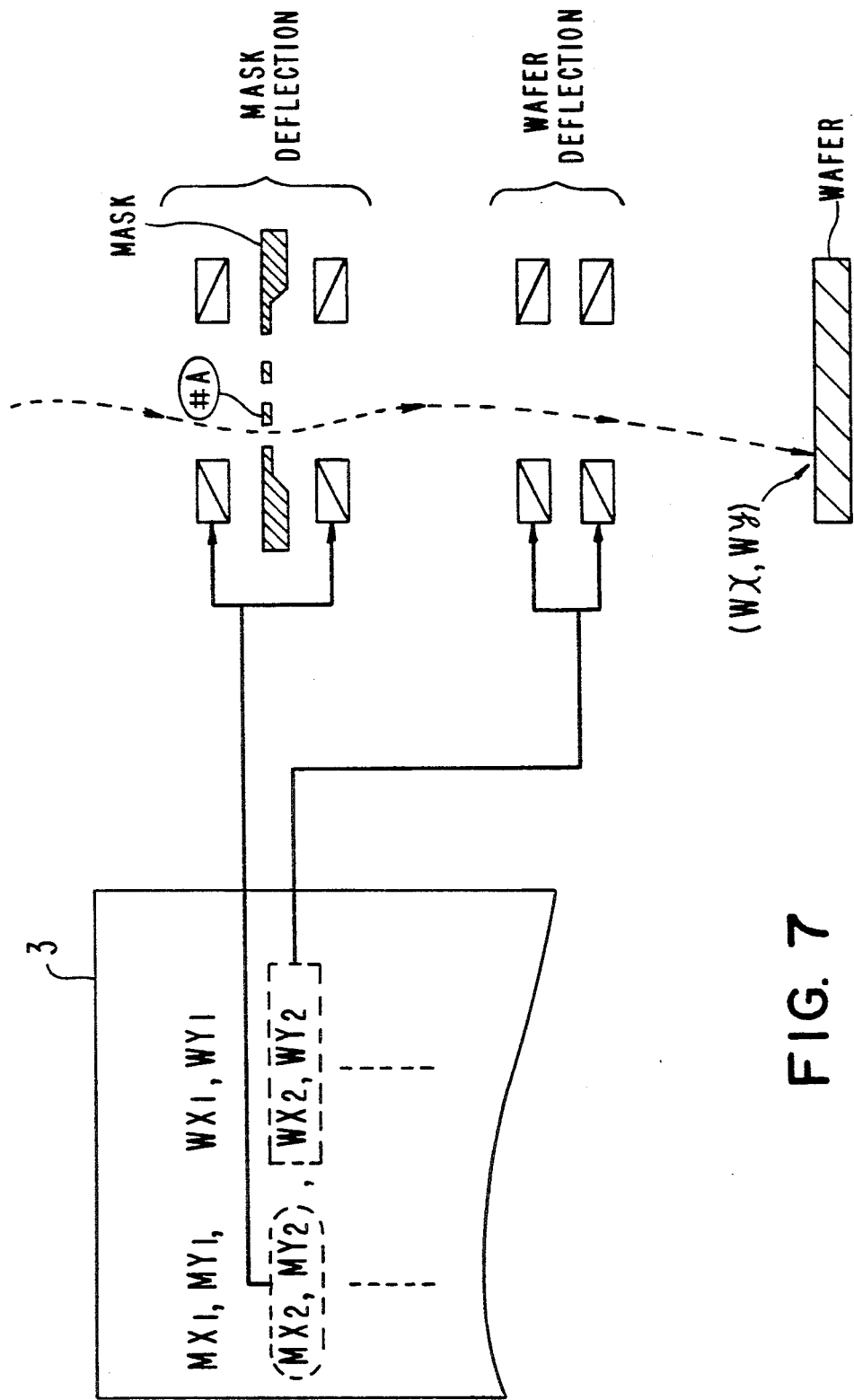

The exposure control part 200 comprises a first storage medium 201 for storing a design data file of IC (corresponding to the CD (design data) of FIG. 6), a second storage medium (first holding means) 202 for storing a pattern exposure data file, which corresponds to the CD and represents exposure patterns on the wafer 123, a third storage medium (second holding means) 203 for storing a mask information data file of the stencil mask 110, a central processing unit (CPU) 204 for computer-controlling the whole of the exposure apparatus, and interfaces 205 and 222 for transmitting the data in each of the above-mentioned storage medium that are read in by the CPU 204. The exposure control part 200 further comprises a data memory 220 for holding the pattern exposure data transmitted from the interface 205, and a mask memory 221 for holding the mask information data transmitted from the interface 222. As shown in FIG. 1, in the above-described pattern exposure data, a mask pattern that is used is indicated with an index (for example, A, B, C, etc). Also, the above-described mask information data are information for deflecting the charged particle beam to each mask pattern, and are provided every mask pattern with an index (for example, A, B, C, etc). The exposure control part 200 further comprises a first controller 207 for selecting one of the mask patterns in the stencil mask 110 on the basis of data in the mask memory 221, for generating mask deflection signals SM1 to SM4 representing a position of the selected mask pattern on the stencil mask 110 and for generating a shape-error adjustment signal $H_{ADJ}$ corresponding to a difference in shape between the shape of a pattern to be exposed and the shape of the selected mask pattern, a first amplifier 208 for generating an adjustment deflection signal $S_{ADJ}$ in accordance with the shape-error adjustment signal $H_{ADJ}$ generated by the first controller 207, a mask transferring mechanism 209 for transferring the stencil mask 110 when necessary, a fifth amplifier 218 disposed between the first controller 207 and the refocus coil 118 for adjusting a focusing level, and a blanking control circuit 210 and second amplifier 211 for generating a blanking signal SB. The exposure control part 200 further comprises a second controller 212 for controlling exposure sequence on the basis of the pattern exposure data transmitted from the data memory 220, a stage transferring mechanism 213 for transferring the wafer stage 126 when necessary, a laser interferometer 214 for detecting a position of the stage 126, a wafer deflection control circuit 215 for computing a beam illumination position on the wafer 123 (i.e., an exposure position on the wafer 123), and third and fourth amplifiers 216 and 217 for generating wafer deflection signals SW1 and SW2 in accordance with the result of the computation by the wafer deflection control circuit 215.

The preparation of the pattern exposure data and the mask information data will be now explained by way of example.

Figure 3:
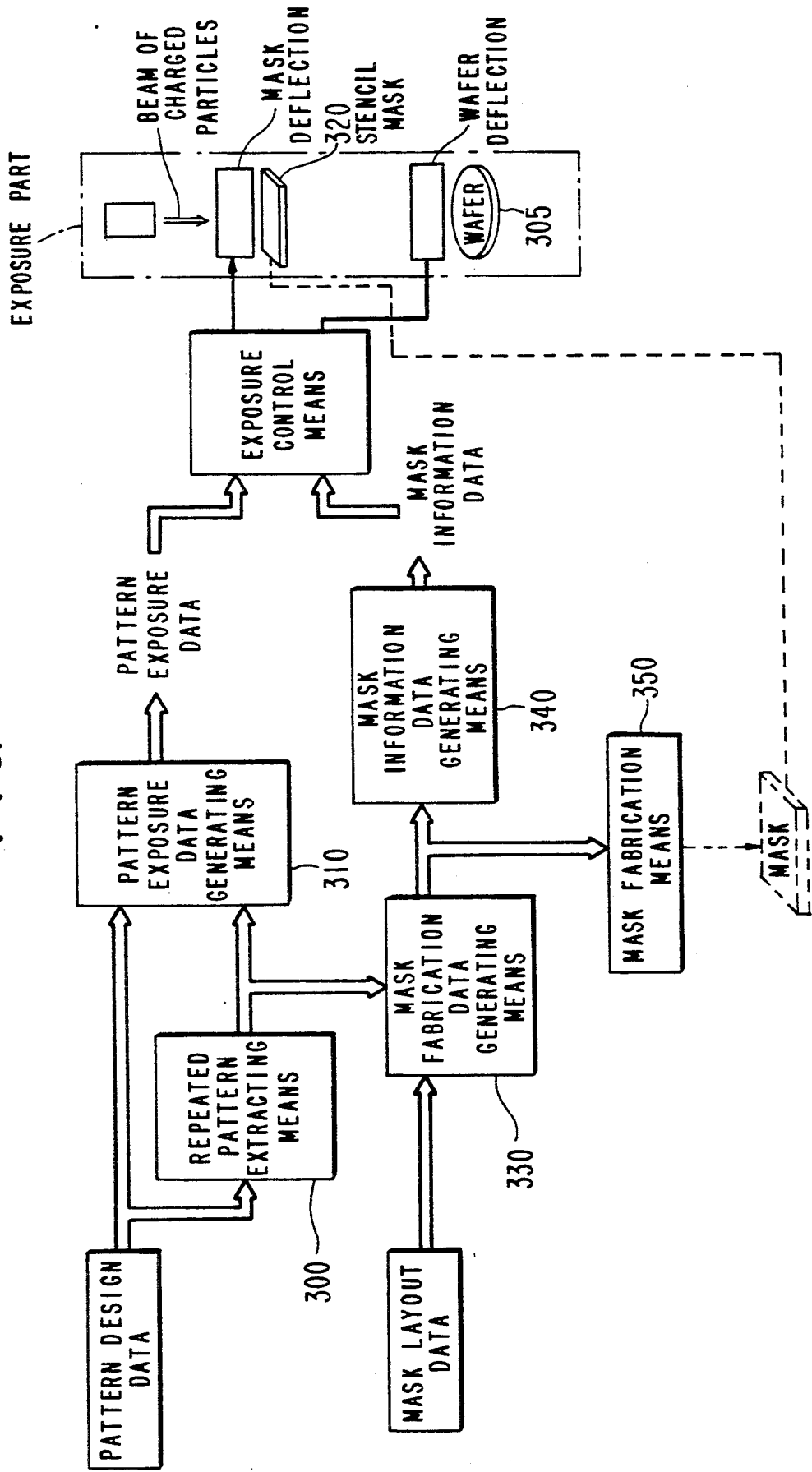
FIG. 3 is a schematic view showing an embodiment of the present invention which is used to explain how the mask information data and the pattern exposure data are prepared.

FIG. 3 schematically shows how the pattern exposure data and the mask information data are prepared. The pattern exposure data for patterns which will be formed on the substrate are inputted to a repeated pattern extracting means 300, and a repeated pattern (mask pattern) is extracted. The repeated pattern output from the repeated pattern extracting means 300, together with the pattern design data, are input to a pattern exposure data generating means 300, which generates pattern exposure data that are deflection information of an illumination position of the repeated pattern on the wafer 305. Note that in the pattern exposure data a mask pattern to be used is designated with an index which is provided every mask pattern. In addition, the repeated pattern output from the repeated pattern extracting means 300, together with mask layout data representing position information of each repeated pattern on the stencil mask 320, are input to a mask fabrication data generating means 330, which generates mask information data for fabricating a stencil mask. The mask fabrication data output from the mask fabrication data generating means 330 is input to a mask fabrication means 350, which fabricates a stencil mask 320. The mask fabrication data outputted from the mask fabrication data generating means 330 is also input to the mask information data generating means 340, which generates mask information data representing conditions for illuminating a beam of charged particles to the individual mask 320 patterns of the stencil mask.

Note that with respect to each mask information indicated in the mask information data, an index is given every mask pattern.

As the mask information, there are position information representing a position of the mask pattern on the stencil mask 320, beam deflecting information representing a condition for deflecting the charged particle beam at the stencil mask 320, mask pattern area information for controlling the refocus coil and adjusting a focusing level, and correction information for correcting exposure time.

Figure 4:
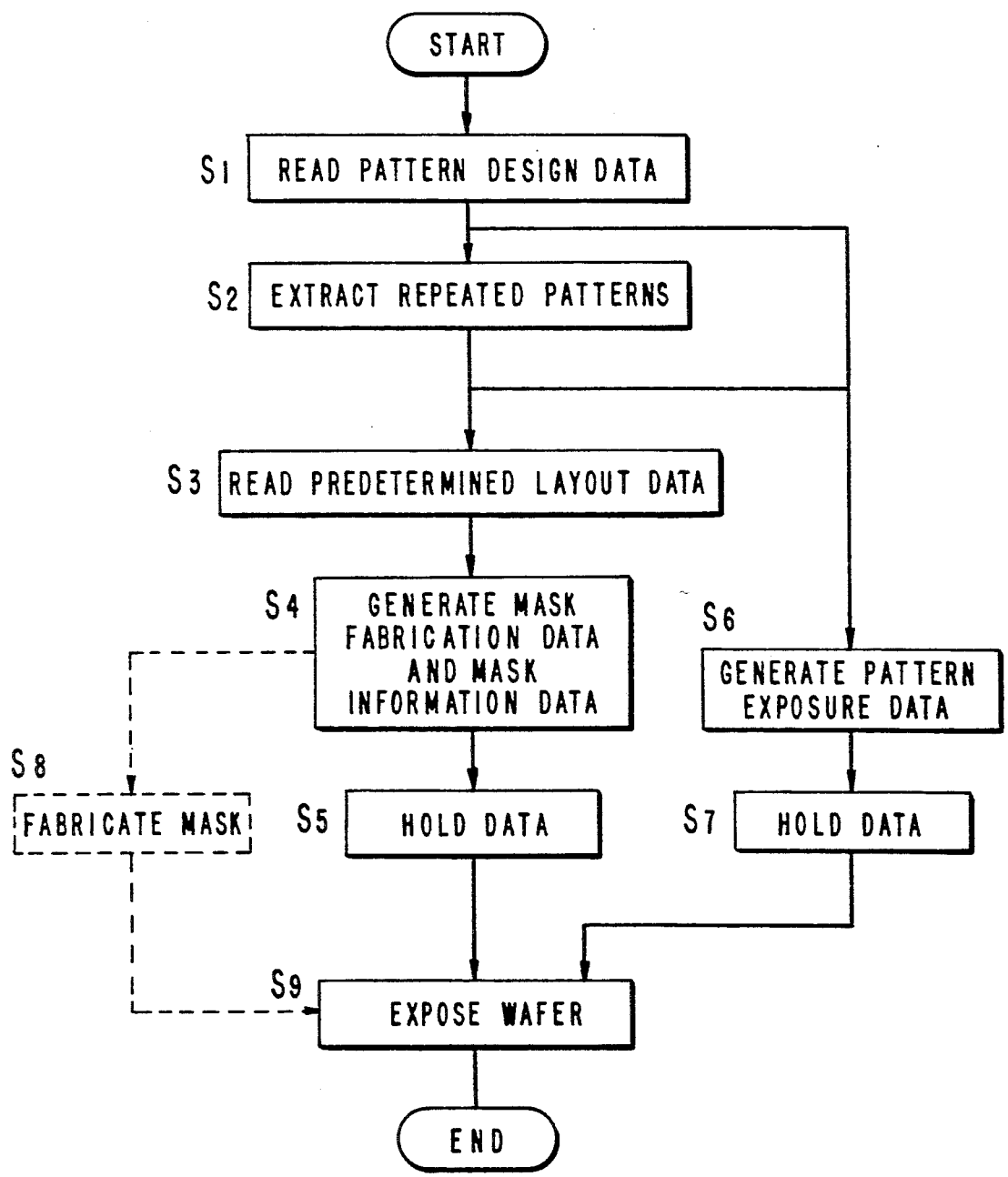
FIG. 4 is a flow diagram of the essential steps used to prepare and carry out the exposure method.
Figure 5:
FIG. 5 is a cross sectional view showing a conventional stencil mask.

The operation of the above embodiment exposure will hereinafter be described in conjunction with the steps shown in FIG. 4.

In step S1, the pattern design data are read out from a pattern design data holding means (not shown), and in step S2, repeated patterns are extracted from among the pattern design data. Predetermined mask layout data are read in step S3 and mask fabrication data and mask information data are generated in step S4. In step S5, the mask information data are written and held in the third storage medium (second holding means) 203.

In step S6, pattern exposure data are generated on the basis of the repeated patterns extracted in the step 2 and on the basis of the pattern design data. In step S7, the generated pattern exposure data are written and held in the second storage medium (first holding means) 202.

After the generation and holding of the mask information data and the pattern exposure data, a mask material is mounted in mask fabrication means (not shown) and formed into the stencil mask 110 according to the mask fabrication data in the step S4 (step S8). After formation of the stencil mask 110, the stencil mask 110 is mounted in the exposure part 100 and the wafer 123 is mounted on the stage 123. The mask information data in the third storage medium 203 is set to the mask memory 221 through the interface 222. The pattern exposure data in the second storage medium is set to the data memory 220 through the interface 205. If a signal to start wafer exposure is output from the CPU 204, the data memory 220 selects an index only, which indicates a mask pattern to be used, from the pattern exposure data and transmits the index to the mask memory 221, and the remaining pattern exposure data are transmitted to the second controller 212. The mask memory 221 that has received the index from the data memory 220 then transmits mask information data corresponding to a mask pattern of the selected index to the first controller 207.

The first controller 207 to which the mask information has been transmitted, and the second controller 212 to which the pattern exposure data have been transmitted control the individual elements of the exposure part 100 and illuminate a controlled charged particle beam onto the wafer 123. The control of each data is performed with a known pipeline processing (step S9).

If, for example, the repeated pattern #A of FIG. 1 is a pattern to be exposed, reference is made to the pattern exposure data file and mask information data file (auxiliary file FA of #A) in accordance with a signal A representing the exposure of the repeated pattern #A. The coordinate data (Mx, My) of one mask pattern taken out from the mask information data file are supplied to the mask deflection part comprising the first to fourth deflectors 111-114. The coordinate data (Wx, Wy) of one repeated pattern taken out from the pattern exposure data file are supplied to the wafer deflection part comprising the main deflection coils 124 and the electron subdeflector 125. The two-stage deflection operation of the mask and wafer deflections is then performed by the mask deflection and wafer deflection parts. As a result, a pattern of a predetermined shape is exposed and formed on a desired position on the wafer 123.

If wafer exposure such as this is repeated over a long period of time, the stencil mask 110 will be deteriorated gradually and the accuracy of exposure will be degraded, as previously mentioned. For this reason, it is necessary to remake the stencil mask 110 at a suitable cycle.

In the embodiment described above, the pattern exposure data file and the mask information data file are separated with each other, and stored in the second storage medium 202 and third storage medium 203, respectively. When the stencil mask 110 is remade, only the mask information data file in the third storage medium 203 is used.

Therefore, in a case where, for example, the number of the mask patterns of the stencil mask 110 is changed, only the mask information data file in the third storage medium 203 is updated and no update of a large-scale pattern exposure data file is required. Consequently, the data update in remaking the stencil mask 110 can be made easier, and work efficiency can be enhanced.

While the subject invention has been described with relation to the preferred embodiment thereof, various modifications and adaptations thereof will now be apparent to those skilled in the art. All such modifications and adaptations as fall within the scope of the appended claims are intended to be covered thereby.

What we claim is:

1. A charged-particle beam exposure method which uses a stencil mask formed with a plurality of mask patterns, deflects a beam of charged particles to a mask pattern selected from among said plurality of mask patterns, and shapes said beam of charged particles, and performs waver exposure by deflecting said shaped beam and illuminating said shaped beam onto a wafer, wherein the improvement comprises the steps of:
   holding mask information data which are information for deflecting said beam of charged particles to said selected mask pattern, in which an index is provided for every one of said plurality of mask patterns of said stencil mask, in a mask memory;
   holding pattern exposure data which are information for designating one of said plurality of mask patterns by the use of said index of each of said plurality of mask patterns held in said mask memory, and for deflecting said beam of charged particles shaped with the designated one of said plurality of mask patterns to a predetermined region of said wafer, in a data memory; and
   deflecting said beam of charged particles on said stencil mask and shaping said beam of charged particles by the use of said mask information data output from said mask memory in response to the index designated in said pattern exposure data.

2. A charged-particle beam exposure method as set forth in claim 1, wherein said mask information data contain position information of each of said plurality of mask patterns on said stencil mask.

3. A charged-particle beam exposure method as set forth in claim 1, wherein said mask information data further contain beam deflection information of said beam of charged particles at said stencil mask.

4. A charged-particle beam exposure method as set forth in claim 1, wherein said mask information data contain area information of each of said plurality of mask patterns through which said beam is passed.

5. A charged-particle beam exposure method as set forth in claim 4, wherein, by said area information of each of said plurality of mask patterns, a refocus coil is controlled and a focusing level is adjusted.

6. A charged-particle beam exposure method as set forth in claim 1, wherein said mask information data contain exposure-time correcting information and wherein said mask information data is used to control an illumination time of said beam of charged particles.

7. A charged-particle beam exposure method as set forth in claim 1, wherein said pattern exposure data are prepared so that said pattern exposure data contain a plurality of steps for extracting a plurality of said mask patterns, which can be used repeatedly at the time of exposure, from design data for patterns by which said wafer is exposed, and preparing information for selecting one mask pattern from among said plurality of mask patterns with a mask index and illuminating at a predetermined position on said wafer, and wherein said mask information data are prepared so that said mask information data contain a step of giving said mask index to information, which is used for deflecting said beam of charged particles onto said mask pattern in which said plurality of mask patterns are arranged in two-dimensional coordinates and for shaping an illumination shape of said beam, for every selected mask pattern.

8. A charged-particle beam exposure apparatus comprising a source of a charged particle beam, a wafer stage having mounted thereon a wafer that is exposed by said charged particle beam, a stencil mask disposed between said source of said charged particle beam and said wafer stage and formed with a plurality of mask patterns through which said charged particles beam is passed and shaped, a mask part deflect controller for controlling deflection conditions of said charged particle beam that is illuminated on said stencil mask, a wafer part deflect controller for controlling deflection conditions of said charged particle beam passed through said stencil mask with respect to said wafer, wherein said charged-particle beam exposure apparatus comprises:
   a mask memory for holding mask information data which are input to said mask part deflect controller, the mask information data being indicated for every one of said plurality of mask patterns with an index; and
   a data memory for holding pattern exposure data which designate a predetermined one of said plurality of mask patterns with said index and also indicate deflection conditions of said charged particle beam passed through said stencil mask with respect to said wafer;
   said index which designates said predetermined one of said plurality of mask patterns being output to said mask memory by said data memory and also said deflection conditions of said charged particle beam passaged through said stencil mask with respect to said wafer being input to said wafer part deflect controller by said data memory;
   said mask information data corresponding to said index being output to said mask part deflect controller by said mask memory to which said index has been input.

9. A charged-particle beam exposure apparatus as set forth in claim 8, wherein said mask information data that are held in said mask memory and said pattern exposure data that are held in said data memory are transmitted from an external storage medium.

10. A charged-particle beam exposure apparatus as set forth in claim 8, wherein the output of data from said data memory, output of data from said mask memory, and operations of said mask part deflection controller and wafer part deflection controller are performed by a pipeline processing.

11. A charged-particle beam exposure method, comprising the steps of:
   a) generating a charged-particle beam;
   b) shaping the charged-particle beam based on data corresponding to a selected one of a plurality of mask patterns determined by an index; and
   c) deflecting the charged-particle beam to a selected location, based on pattern exposure data including data corresponding to the selected location, the pattern exposure data also including the index for selecting the data corresponding to the selected one of the plurality of mask patterns used in said step (b).

12. A charged-particle beam exposure method as set forth in claim 11, wherein said steps (a) through (c) are repeatedly executed.

13. A charged-particle beam exposure method, comprising the steps of:
   a) storing a plurality of first data strings, each of the plurality of first data strings including location data and index data;
   b) storing a plurality of second data strings, each of the plurality of second data strings including mask shape data and being identified by an index;
   c) generating a charged-particle beam;

d) shaping the charged-particle beam based on the mask shape data included within a selected one of the plurality of second data strings identified by the index determined by the index data of a selected one of the plurality of first data strings, to provide a shaped charged-particle beam; and e) directing the shaped charged-particle beam based on the location data included within the selected one of the plurality of first data strings.

14. A charged-particle beam exposure method as set forth in claim 13, wherein said steps (c)–(e) are repeatedly executed.

* * * * *

UNITED STATES PATENT AND TRADEMARK OFFICE
CERTIFICATE OF CORRECTION

PATENT NO. : 5,130,547
DATED : July 14, 1992
INVENTOR(S) : Sakamoto et al.

It is certified that error appears in the above-identified patent and that said Letters Patent is hereby corrected as shown below:

- Column 2, line 12, delete "as".

Column 5, line 36, after "mask"

(second occurrence only) insert --320--.

Column 7, line 6, change "waver" to

--wafer--;

Column 8, line 26, change "passaged"

to --passed--.

Signed and Sealed this

Twenty-eighth Day of September, 1993

Attest:

BRUCE LEHMAN

Attesting Officer     Commissioner of Patents and Trademarks